(12) United States Patent
Mochizuki et al.

(10) Patent No.: US 11,035,883 B2
(45) Date of Patent: Jun. 15, 2021

(54) INTERMEDIATE CONNECTION MEMBER AND INSPECTION APPARATUS

(71) Applicant: TOKYO ELECTRON LIMITED, Tokyo (JP)

(72) Inventors: Jun Mochizuki, Nirasaki (JP); Hiroaki Hayashi, Nirasaki (JP); Kanji Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/596,012

(22) Filed: Oct. 8, 2019

(65) Prior Publication Data

US 2020/0116756 A1    Apr. 16, 2020

(30) Foreign Application Priority Data

Oct. 15, 2018 (JP) .............................. JP2018-194623

(51) Int. Cl.
| | | |
|---|---|---|
| *G01R 1/04* | (2006.01) | |
| *G01R 1/067* | (2006.01) | |
| *G01R 1/073* | (2006.01) | |
| *G01R 31/27* | (2006.01) | |
| *G01R 1/20* | (2006.01) | |

(52) U.S. Cl.
CPC ....... *G01R 1/0416* (2013.01); *G01R 1/07342* (2013.01); *G01R 1/20* (2013.01); *G01R 31/275* (2013.01)

(58) Field of Classification Search
CPC .......... G01R 1/04; G01R 1/067; G01R 1/073; G01R 1/07314; G01R 1/07342; G01R 1/07378; G01R 1/20; G01R 31/27; G01R 31/28
See application file for complete search history.

(56) References Cited

U.S. PATENT DOCUMENTS

| | | | |
|---|---|---|---|
| 6,636,057 B1 * | 10/2003 | Uchikura | G01R 1/07371 324/756.05 |
| 9,535,090 B2 * | 1/2017 | Inoue | G01R 1/07307 |
| 2004/0239357 A1 * | 12/2004 | Tashiro | G01R 1/0483 324/754.13 |

(Continued)

FOREIGN PATENT DOCUMENTS

| | | |
|---|---|---|
| JP | H07111280 A | 4/1995 |
| JP | 2001-50979 A | 2/2001 |

(Continued)

*Primary Examiner* — Neel D Shah
(74) *Attorney, Agent, or Firm* — Nath, Goldberg & Meyer; Jerald L. Meyer; Tanya E. Harkins

(57) ABSTRACT

There is provided an intermediate connection member provided between a first member having a plurality of first terminals and a second member having a plurality of second terminals to electrically connect the plurality of first terminals and the plurality of second terminals, respectively. The intermediate connection member includes: a block member including connection members configured to electrically connect the plurality of first terminals and the plurality of second terminals, respectively; a frame member having an insertion hole into which the block member is inserted; and an electronic component electrically connected to one of the connection members.

5 Claims, 6 Drawing Sheets

(56) References Cited

U.S. PATENT DOCUMENTS

| | | | |
|---|---|---|---|
| 2006/0125498 A1* | 6/2006 | Liu | G01R 1/07378 324/756.03 |
| 2008/0258745 A1* | 10/2008 | Hosaka | G01R 1/07342 324/756.03 |
| 2010/0009471 A1* | 1/2010 | Mizoguchi | G01R 1/07378 438/15 |
| 2010/0301889 A1* | 12/2010 | Sakata | G01R 31/2889 324/756.07 |
| 2012/0194213 A1* | 8/2012 | Komatsu | G01R 31/2887 324/756.03 |
| 2015/0260788 A1* | 9/2015 | Yamada | G01R 1/0491 324/750.25 |

FOREIGN PATENT DOCUMENTS

| | | | |
|---|---|---|---|
| JP | 2010025765 A | | 2/2010 |
| KR | 10-2018-0082526 A | | 7/2018 |

* cited by examiner

INTERMEDIATE CONNECTION MEMBER AND INSPECTION APPARATUS

CROSS-REFERENCE TO RELATED APPLICATION

This application is based upon and claims the benefit of priority from Japanese Patent Application No. 2018-194623, filed on Oct. 15, 2018, the entire contents of which are incorporated herein by reference.

TECHNICAL FIELD

The present disclosure relates to an intermediate connection member and an inspection apparatus.

BACKGROUND

In a semiconductor device manufacturing process, an inspection apparatus is used to perform an electrical inspection on a plurality of devices formed on a substrate. The inspection apparatus includes a prober equipped with a probe card, a tester that applies an electric signal to the device through the probe card to inspect various electric characteristics of the device, and the like. The probe card has probes which come into contact with the device formed on the substrate.

In such an inspection apparatus, electronic components, such as a bypass capacitor for cutting high frequency noise and an external circuit such as a response waveform correction circuit, are mounted on the probe card (see, for example, Patent Documents 1 and 2).

PRIOR ART DOCUMENT

Patent Documents

Patent Document 1: Japanese Laid-Open Patent Publication No. H7-111280
Patent Document 2: Japanese Laid-Open Patent Publication No. 2010-25765

SUMMARY

According to an embodiment of the present disclosure, there is provided an intermediate connection member provided between a first member having a plurality of first terminals and a second member having a plurality of second terminals to electrically connect the plurality of first terminals and the plurality of second terminals, respectively, the intermediate connection member including: a block member including connection members configured to electrically connect the plurality of first terminals and the plurality of second terminals, respectively; a frame member having an insertion hole into which the block member is inserted; and an electronic component electrically connected to one of the connection members.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Figure 1:
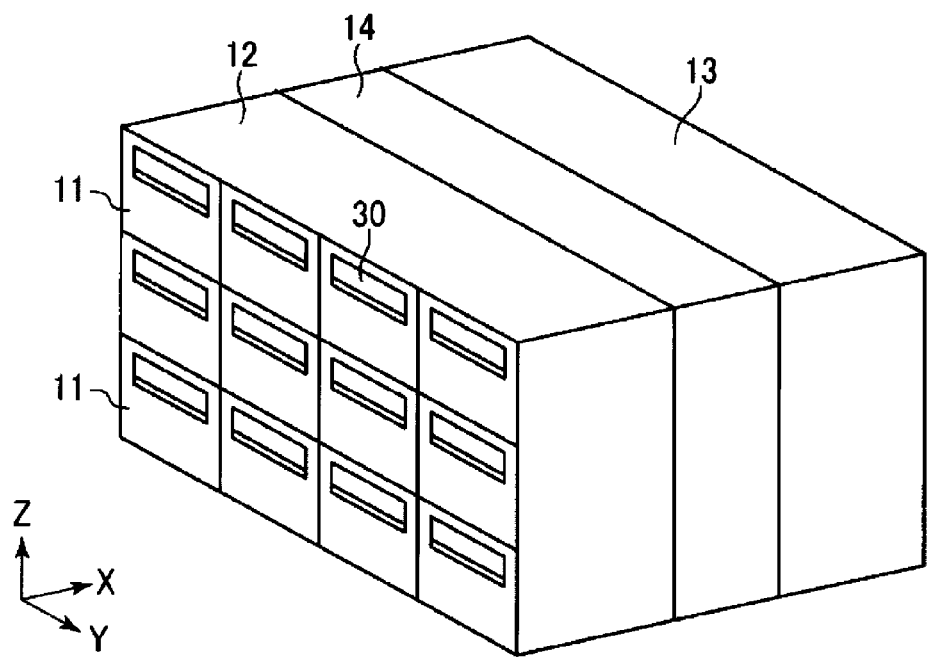
FIG. 1 is a perspective view illustrating an exemplary configuration of an inspection system equipped with a plurality of inspection apparatuses according to an embodiment.

Hereinafter, non-limitative exemplary embodiments of the present disclosure will now be described with reference to the accompanying drawings. In all the accompanying drawings, the same or corresponding members or components will be denoted by the same or corresponding reference numerals, and redundant explanations thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a perspective view illustrating an exemplary configuration of an inspection system equipped with a plurality of inspection apparatuses according to an embodiment. An inspection system 10 is a system for inspecting various electrical characteristics of a plurality of devices under test (DUTs) formed in a semiconductor wafer (hereinafter, referred to as a "wafer") W as an inspection object by applying an electrical signal to the DUTs.

The inspection system 10 has a rectangular parallelepiped shape as a whole and includes an inspection part 12 having a plurality of inspection rooms (cells) 11, and a loader part 13 that loads/unloads the wafer W into/from each of the inspection rooms 11. In the inspection part 12, four inspection rooms 11 are arranged in the horizontal direction to form a row. The rows thus formed are arranged in three stages in the vertical direction. Further, a transfer part 14 is provided between the inspection part 12 and the loader part 13. A transfer mechanism (not shown) for delivering the wafer W between the loader part 13 and each of the inspection rooms 11 is provided inside the transfer part 14. An inspection apparatus to be described later is provided inside each of the inspection rooms 11. A tester 30, which is a portion of the inspection apparatus, is inserted into each of the inspection rooms 11 from the front side of the inspection part 12. In FIG. 1, the depth direction of the inspection room 11 is defined as an X direction, the arrangement direction of the inspection rooms 11 is defined as a Y direction, and the height direction is defined as a Z direction.

Figure 2:
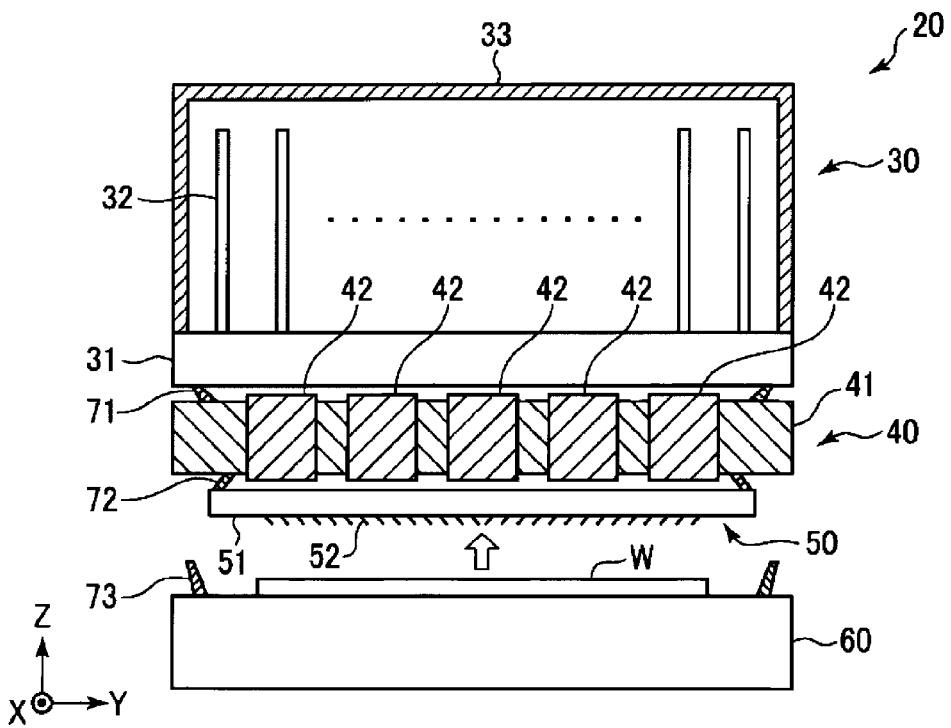
FIG. 2 is a schematic cross-sectional view illustrating the inspection apparatus provided in the inspection system of FIG. 1.

FIG. 2 is a schematic cross-sectional view illustrating the inspection apparatus provided in the inspection system 10 of FIG. 1. An inspection apparatus 20 includes the tester 30, an intermediate connection member 40 and a probe card 50. In the inspection apparatus 20, the electrical characteristics of the DUTs formed on the wafer W is inspected by the tester 30 via the probe card 50.

The tester 30 includes a tester motherboard 31 provided horizontally, a plurality of test circuit boards 32 mounted upright in slots of the tester motherboard 31, and a housing 33 in which the test circuit boards 32 are accommodated. A plurality of terminals (not shown) is provided in bottom of the tester motherboard 31.

The probe card 50 includes a plate-like base 51 having a plurality of terminals (not shown) formed on the upper surface thereof, and a plurality of probes 52 provided on the lower surface of the base 51. The plurality of probes 52 are in contact with the DUTs formed on the wafer W. The wafer W is positioned by an aligner (not shown) in a state where the wafer W is attracted onto a stage 60. The probes 52 are in contact with the plurality of DUTs, respectively.

The intermediate connection member 40 is provided to electrically connect the tester 30 and the probe card 50 and includes a pogo frame 41 and pogo blocks 42.

Figure 3:
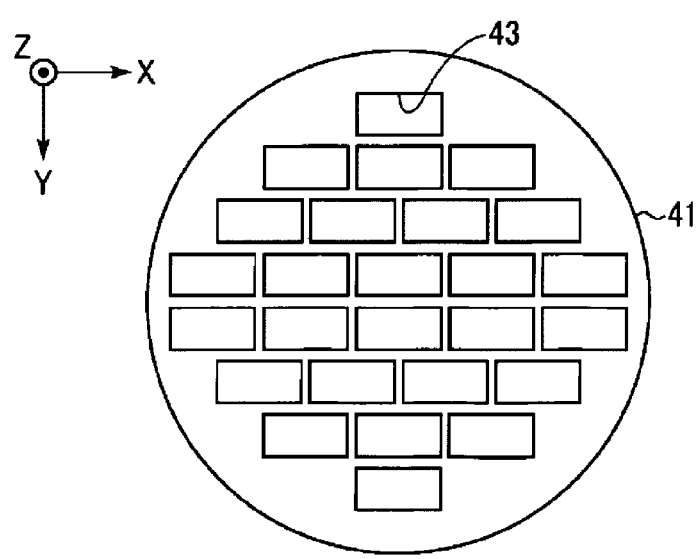
FIG. 3 is a plan view illustrating a pogo frame of an intermediate connection member in the inspection apparatus of FIG. 2.

The pogo frame 41 is made of a material having high strength, high rigidity and a small thermal expansion coefficient, such as a NiFe alloy. As shown in FIG. 3, the pogo frame 41 has a plurality of rectangular insertion holes 43 formed to penetrate in the depth direction of the pogo frame 41. The pogo blocks 42 are inserted into the insertion holes 43, respectively. FIG. 3 is a plan view illustrating the pogo frame 41 of the intermediate connection member 40 in the inspection apparatus 20 of FIG. 2.

The pogo blocks 42 are positioned with respect to the pogo frame 41 and connect the terminals of the tester motherboard 31 in the tester 30 and the terminals of the base 51 in the probe card 50. Details of the pogo blocks 42 will be described later.

A seal member 71 is provided between the tester motherboard 31 and the pogo frame 41. A space between the tester motherboard 31 and the intermediate connection member 40 is evacuated, whereby the intermediate connection member 40 is attracted onto the tester motherboard 31 via the seal member 71. A seal member 72 is provided between the pogo frame 41 and the probe card 50. A space between the intermediate connection member 40 and the probe card 50 is evacuated, whereby the probe card 50 is attracted onto the intermediate connection member 40 via the seal member 72.

A seal member 73 is provided on an upper surface of the stage 60 so as to surround the wafer W. The stage 60 is raised by an aligner (not shown) provided in each stage to bring the probes 52 of the probe card 50 into contact with the electrodes of the DUTs formed on the wafer W. The stage 60 is attracted onto the intermediate connection member 40 by bringing the seal member 73 into contact with the pogo frame 41 of the intermediate connection member 40 and evacuating a space surrounded by the seal member 73.

First Configuration Example

Figure 4:
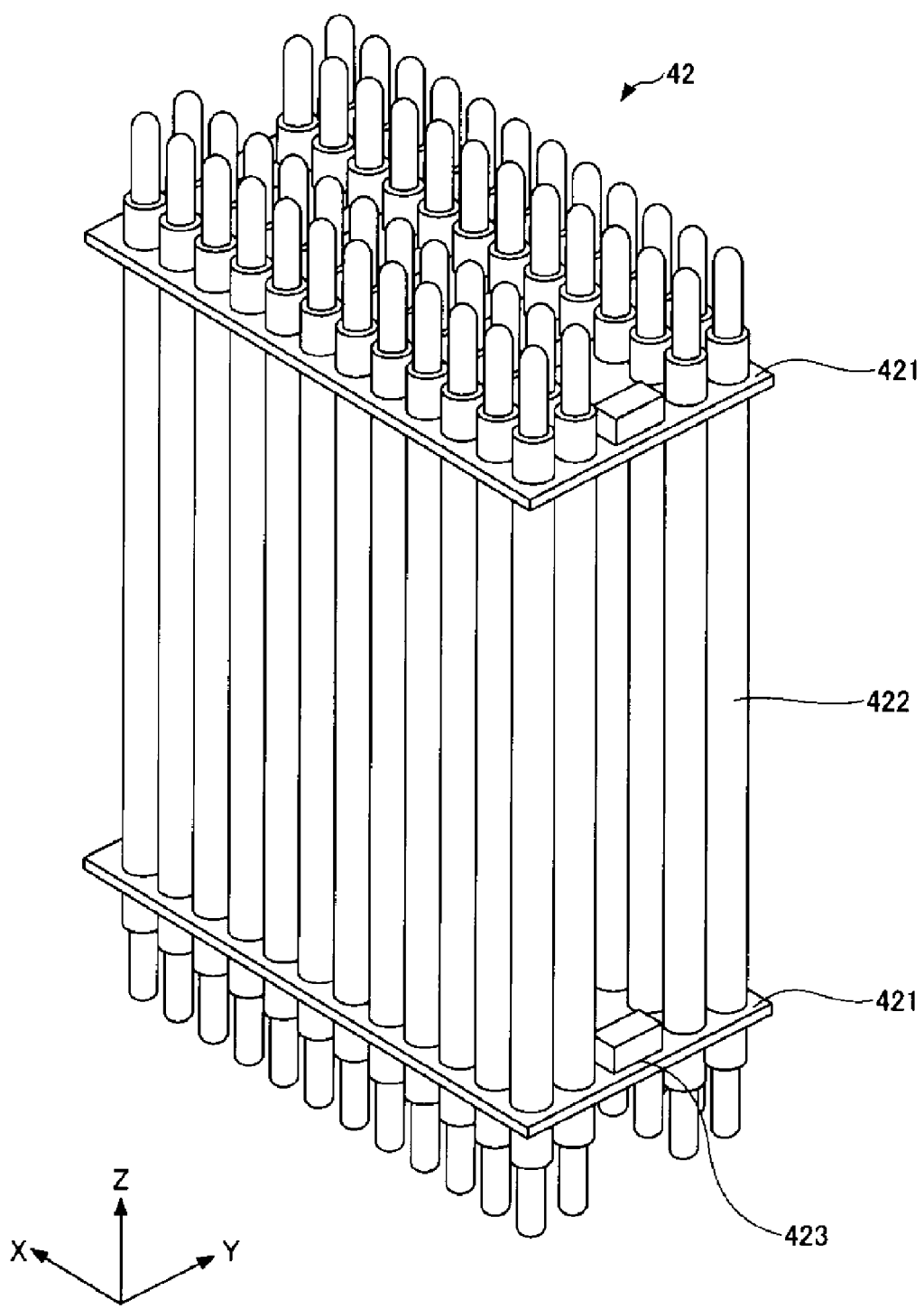
FIG. 4 is a perspective view illustrating a pogo block according to a first configuration example.
Figure 5:
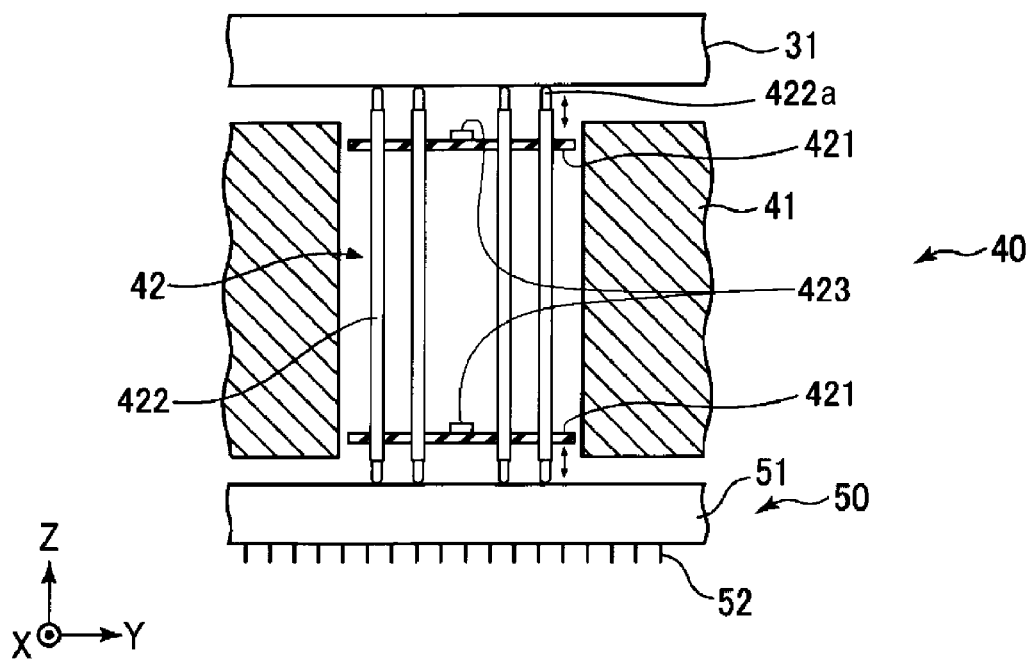
FIG. 5 is a schematic cross-sectional view illustrating a state in which the pogo block of FIG. 4 is inserted into the pogo frame.

Next, the pogo block 42 of a first configuration example will be described with reference to FIGS. 4 and 5. FIG. 4 is a perspective view illustrating the pogo block 42 of the first configuration example. FIG. 5 is a schematic sectional view illustrating a state in which the pogo block 42 of FIG. 4 is inserted into the pogo frame 41.

The pogo block 42 includes substrates 421 and connection pins 422. In an embodiment, two substrates 421 are provided in parallel to one another. 48 connection pins 422 are provided in parallel to one another. However, the number of substrates 421 and the number of connection pins 422 are not limited thereto.

Each substrate 421 is provided in parallel with the tester motherboard 31 and the base 51, and is formed in a rectangular shape having long sides and short sides in a plan view. A direction parallel to the long side is defined as the X direction, and a direction parallel to the short side is defined as the Y direction. A length of the long side is determined depending on a length of the insertion hole 43 formed in the pogo frame 41 in the long-side direction. For example, the length of the long side is slightly shorter than a length in the long-side direction of the insertion hole 43. A length of the short side is determined depending on a length of the insertion hole 43 formed in the pogo frame 41 in the short-side direction. For example, the length of the short side is slightly shorter than a length of the insertion hole 43 in the short-side direction. The substrate 421 is attached to the pogo frame 41 by, for example, a fixing member (not illustrated). The substrate 421 has insertion holes (not illustrated) into which the respective connection pins 422 are inserted, and supports the connection pins 422 in the state in which the connection pins 422 are inserted into the respective insertion holes. The substrate 421 is formed of an insulating material. Wiring lines (not illustrated) are formed on the substrate 421. As the substrate 421, various printed boards may be used. For example, a rigid substrate such as a glass epoxy substrate or a ceramic substrate may be used, or a flexible substrate such as a polyimide film or a polyester film may be used.

On an upper surface of the substrate 421, various electronic components 423 used to inspect the electrical characteristics of the plurality of DUTs formed on the wafer are provided. The electronic components 423 are electrically connected to the wiring lines formed on the substrate 421. In addition, the electronic components 423 are electrically connected to the connection pins 422 through the wiring lines formed on the substrate 421. In an embodiment, the electronic components 423 are bypass capacitors for removing high-frequency noise, for example, capacitors having a capacitance of 1 µF to 4.7 µF. By mounting the bypass capacitors on the upper surface of the substrate 421 as described above, the bypass capacitors mounted on the probe card 50 in the related art become unnecessary. This makes it possible to reduce the number of electronic components mounted on the probe card 50. In addition, it is possible to arrange the probes 52 on the probe card 50 with high density.

The electronic component 423 may be a termination resistor for impedance matching of the probes 52. Further, the electronic component 423 is not limited to the bypass capacitor or the termination resistor described above, and may be, for example, a coil. The electronic component 423 is not limited to a passive element such as a capacitor, a resistor, a coil or the like, and may be an active element such as a transistor, a diode, a relay or the like. In addition, the electronic component 423 may be a circuit board or an integrated circuit (IC). By mounting various electronic components 423 on the upper surface of the substrate 421 as described above, it is possible to reduce the number of electronic components mounted on the probe card 50. In addition, various electronic components 423 may be mounted on a lower surface of the substrate 421, or may be mounted on both the upper and lower surfaces of the substrate 421. Furthermore, the electronic components 423 may be mounted on the pogo frame 41.

The connection pin 422 is a rod-shaped member, which is formed of a conductive material and are expandable/contractable by, for example, a spring. The connection pin 422 may be, for example, a pogo pin. The pogo pin is also referred to as a spring pin or a contact probe. The connection pins 422 are supported by the substrate 421 so as to overlap the respective terminals of the tester motherboard 31 and the respective terminals of the base 51 in a plan view. In other words, upper ends of the connection pins 422 are arranged to be in contact with the respective terminals of the tester motherboard 31, and lower ends of the connection pins 422 are arranged to be in contact with the respective terminals of the base 51. The tester motherboard 31 and the intermediate connection member 40 are vacuum-attracted to each other so that the terminals of the tester motherboard 31 and the connection pins 422 are electrically connected to each other. In addition, the base 51 of the probe card 50 and the intermediate connection member 40 are vacuum-attracted to each other so that the terminals of the base 51 and the connection pins 422 are electrically connected to each other. Thus, the terminals of the tester motherboard 31 and the terminals of the base 51 are electrically connected to each other via the respective connection pins 422. Each connection pin 422 may be configured to include a rod-shaped member formed of a conductive material and an elastic terminal 422a provided at at least one end of the rod-shaped member and having conductivity.

According to the intermediate connection member 40 having the pogo block 42 of the first configuration example described above, the various electronic components 423 used to inspect the electrical characteristics of the plurality of DUTs formed on the wafer are mounted on the substrate 421. This makes it possible to reduce the number of electronic components mounted on the probe card 50. This facilitates the design of the probe card 50, which shortens a production time of the probe card 50 and reduces a production cost. As a result, it is possible to reduce the cost involved in the replacement of the probe card 50 with new ones when the probes 52 are worn, thus reducing test costs. In addition, by reducing the number of electronic components mounted on the probe card 50, it is possible to make the wiring lines of the probe card 50 thick and short. Thus, it is possible to reduce the resistance value of the wiring lines and the occurrence of noise. As a result, it is possible to implement stable inspection with less noise.

Second Configuration Example

Figure 6:
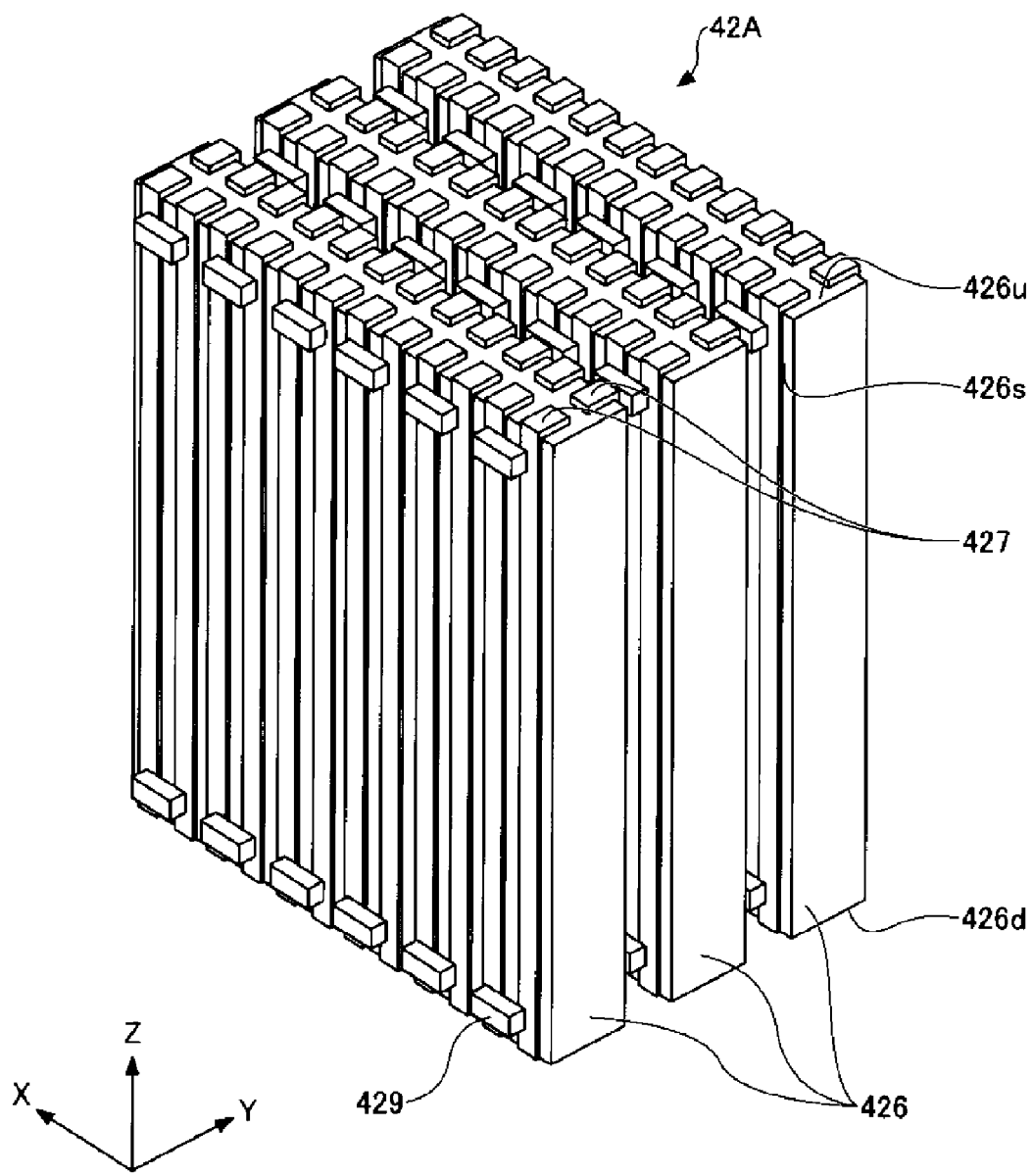
FIG. 6 is a perspective view illustrating a pogo block according to a second configuration example.
Figure 7:
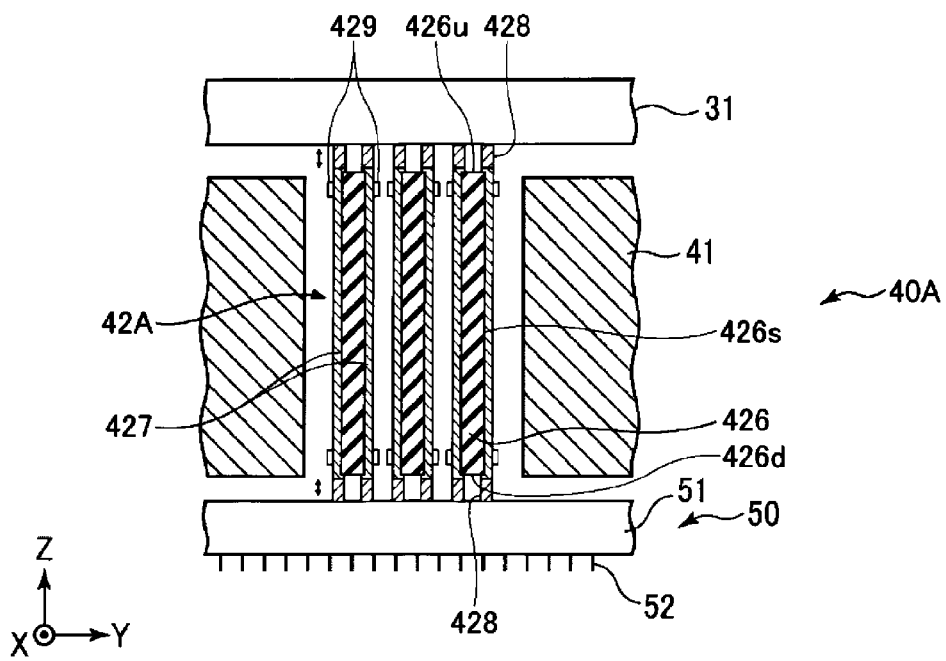
FIG. 7 is a schematic cross-sectional view illustrating a state in which the pogo block of FIG. 6 is inserted into the pogo frame.

Next, a pogo block 42A of a second configuration example will be described with reference to FIGS. 6 and 7. FIG. 6 is a perspective view illustrating the pogo block 42A of the second configuration example. FIG. 7 is a schematic sectional view illustrating a state in which the pogo block 42A of FIG. 6 is inserted into the pogo frame 41.

The pogo block 42A includes substrates 426, wiring lines 427, and connection terminals 428. In an embodiment, three substrates 426 are provided in parallel to one another at predetermined intervals. However, the number and arrangement of substrates 426 are not limited thereto.

Each substrate 426 is formed in a rectangular shape, and is provided to be perpendicular to the tester motherboard 31 and the base 51. The substrate 426 is attached to the pogo frame 41 by, for example, a fixing member (not illustrated). The plurality of wiring lines 427 are formed on the substrate 426. The substrate 426 is formed of an insulating material.

As the substrate 426, various printed boards may be used. For example, a rigid substrate such as a glass epoxy substrate or a ceramic substrate may be used, or a flexible substrate such as a polyimide film or a polyester film may be used.

On a side surface 426s of the substrate 426, various electronic components 429 used to inspect the electrical characteristics of the plurality of DUTs formed on the wafer are provided. The electronic components 429 are electrically connected to the wiring lines 427 formed on the substrate 426. In an embodiment, the electronic component 429 may be a bypass capacitor for removing high-frequency noise, for example, a capacitor having a capacitance of 1 µF to 4.7 µF. By mounting the bypass capacitors on the side surface 426s of the substrate 426, the bypass capacitors mounted on the probe card 50 in the related art become unnecessary. This makes it possible to reduce the number of electronic components mounted on the probe card 50. In addition, it is possible to arrange the probes 52 on the probe card 50 with high density.

The electronic component 429 may be, for example, a termination resistor for impedance matching of the probes 52. The electronic component 429 is not limited to the bypass capacitor or the termination resistor described above, and may be, for example, a coil. The electronic component 429 is not limited to a passive element such as, for example, a capacitor, a resistor, a coil or the like, and may be an active element such as, for example, a transistor, a diode, a relay or the like. In addition, the electronic component 429 may be a circuit board or an integrated circuit. By mounting various electronic components 429 on the side surfaces 426s of the substrate 426 as described above, it is possible to reduce the number of electronic components mounted on the probe card 50. In some embodiments, various electronic components 429 may be mounted on one of the side surfaces 426s of the substrate 426, or may be mounted on both the side surfaces 426s of the substrate 426. Furthermore, the electronic components 429 may be mounted on the pogo frame 41. In addition, in the example of FIGS. 6 and 7, the electronic components 429 are mounted on the both the side surfaces 426s of the substrate 426.

The wiring line 427 is formed of a conductive material. The wiring line 427 is formed to extend from a lower surface 426d of the substrate 426 to an upper surface 426u through the side surface 426s. Connection terminals 428 are connected to both ends of the wiring lines 427. In other words, the connection terminals 428 are connected to portions of the wiring lines 427 formed on the lower surface 426d and the upper surface 426u of the substrate 426.

The connection terminals 428 are connected to the both ends of the wiring lines 427. The connection terminal 428 is a conductive elastic terminal. The connection terminals 428 are arranged so as to overlap the respective terminals of the tester motherboard 31 and the respective terminals of the base 51 in a plan view. In other words, upper ends of the connection terminals 428 are arranged to be in contact with the respective terminals of the tester motherboard 31, and lower ends of the connection terminals 428 are arranged to be in contact with the respective terminals of the base 51. The tester motherboard 31 and the intermediate connection member 40A are vacuum-attracted to each other so that the terminals of the tester motherboard 31 and the connection terminals 428 are electrically connected to each other. In addition, the base 51 of the probe card 50 and the intermediate connection member 40A are vacuum-attracted to each other so that the terminals of the base 51 and the connection terminals 428 are electrically connected to each other. Thus, the terminals of the tester motherboard 31 and the terminals of the base 51 are electrically connected to each other via the wiring lines 427 and the connection terminals 428, respectively.

According to the intermediate connection member 40A having the pogo block 42A of the second configuration example described above, the various electronic components 429 used to inspect the electrical characteristics of the plurality of DUTs formed on the wafer are mounted on the substrate 426. This makes it possible to reduce the number of electronic components mounted on the probe card 50. This facilitates the design of the probe card 50, thus shortening a production time of the probe card 50, and reducing a production cost. As a result, it is possible to reduce the cost involved in the replacement of the probe card 50 with new ones when the probes 52 are worn, thus reducing test costs. In addition, by reducing the number of electronic components mounted on the probe card 50, it is possible to make the wiring lines of the probe card 50 thick and short, thus reducing noise. As a result, it is possible to implement stable inspection with less noise.

In the above embodiment, the tester motherboard 31 is an example of a first member, and the terminals of the tester motherboard 31 are an example of first terminals. The probe card 50 is an example of a second member, and the terminals of the base 51 are an example of second terminals. In addition, the pogo frame 41 is an example of a frame member, the pogo block 42 or 42A are an example of a block member, the substrate 421 is an example of a support member. The connection pins 422, the wiring lines 427, and the connection terminals 428 are examples of connection members.

According to the present disclosure, it is possible to reduce test costs.

It should be noted that the embodiments disclosed herein are exemplary in all respects and are not restrictive. The above-described embodiments may be omitted, replaced or modified in various forms without departing from the scope and spirit of the appended claims.

In the above embodiment, the inspection apparatuses 20 in the inspection system 10 having the plurality of inspection rooms 11 are described as an example, but the present disclosure is not limited thereto. As an example, a single inspection apparatus may be used.

What is claimed is:

1. An intermediate connection member provided between a first member having a plurality of first terminals and a second member having a plurality of second terminals to electrically connect the plurality of first terminals and the plurality of second terminals, respectively, the intermediate connection member comprising:

a plurality of block members, each including connection members configured to electrically connect the plurality of first terminals and the plurality of second terminals, respectively;

a frame member having a plurality of insertion holes into which the plurality of block members is inserted, respectively, the frame member as a whole being a single body; and a plurality of electronic components electrically connected to the connection members, wherein the first member and the second member are selectively electrically connected with each other via the intermediate connection member, wherein the plurality of electronic components are passive elements and the passive elements include a capacitor, wherein the first member is a tester motherboard of a tester configured to apply an electric signal to a plurality of devices formed on a substrate and to inspect an electrical characteristic of each of the plurality of devices, and the second member is a probe card having a probe to be in contact with electrodes of the plurality of devices, and wherein the probe card does not have the capacitor.

2. The intermediate connection member of claim 1, wherein the plurality of electronic components is mounted on the plurality of block members.

3. The intermediate connection member of claim 2, wherein the connection members are pogo pins, each of the plurality of block members includes a support member configured to support each of the pogo pins, and each of the plurality of electronic components is mounted on the support member.

4. The intermediate connection member of claim 2, wherein the connection members include connection pins, and an elastic connection terminal provided at at least one end of each of the connection pins, each of the plurality of block members includes a support member configured to support each of the connection pins, and each of the plurality of electronic components is mounted on the support member.

5. The intermediate connection member of claim 2, wherein each of the connection members includes a connection member substrate on which a wiring line is formed, and elastic connection terminals provided at both ends of the wiring line, and each of the plurality of electronic components is mounted on the connection member substrate.

* * * * *